US 6,574,264 B2

(12) United States Patent
Lee et al.

(10) Patent No.: US 6,574,264 B2
(45) Date of Patent: Jun. 3, 2003

(54) APPARATUS FOR GROWING A SILICON INGOT

(75) Inventors: Hong-Woo Lee, Gumi-shi (KR); Joon-Young Choi, Kyongsangbuk-do (KR); Hyon-Jong Cho, Bucheon-shi (KR)

(73) Assignee: Siltron Inc., Gumi-shi (KR)

( * ) Notice: Subject to any disclaimer, the term of this patent is extended or adjusted under 35 U.S.C. 154(b) by 0 days.

(21) Appl. No.: 10/029,949

(22) Filed: Dec. 31, 2001

(65) Prior Publication Data

US 2002/0191667 A1 Dec. 19, 2002

(30) Foreign Application Priority Data

Jun. 16, 2001 (KR) ..................................... 2001-0034143

(51) Int. Cl.[7] ................................................. H05B 3/00
(52) U.S. Cl. .............................. 373/79; 373/26; 117/13
(58) Field of Search ................................ 373/5, 15, 26, 373/27, 28, 60, 67, 109, 110; 219/390, 411; 117/83, 13, 217, 900, 932, 936, 946, 950, 955; 164/122.2

(56) References Cited

U.S. PATENT DOCUMENTS

| | | | | |
|---|---|---|---|---|
| 3,898,051 A | * | 8/1975 | Schmid | 117/83 |
| 4,663,763 A | * | 5/1987 | Winstanley et al. | 373/26 |
| 6,183,553 B1 | * | 2/2001 | Holder et al. | 117/13 |

* cited by examiner

Primary Examiner—Tu Ba Hoang
(74) Attorney, Agent, or Firm—Jacobson Holman PLLC

(57) ABSTRACT

An apparatus for growing a silicon ingot including a graphite crucible in which a quartz crucible is placed, a driving axis connected to a lower part of the graphite crucible to revolve and move the graphite crucible up and down so as to support the graphite crucible, a heating element to heat the graphite crucible, and an insulating wall to protect and thermally isolate the graphite crucible, heating means, and driving axis in part from the external environment. The driving axis includes a hollow axis part having a hollow inside, an insulating axis part attached to the bottom of the hollow axis part to inhibit heat transfer, and a cylindrical axis part attached to the bottom of the insulating axis part. The construction of the driving axis reduces a temperature gradient in the molten silicon, improving uniform heat distribution for increased silicon ingot quality.

7 Claims, 4 Drawing Sheets

APPARATUS FOR GROWING A SILICON INGOT

BACKGROUND OF THE INVENTION

1. Field of the Invention

The present invention relates to an apparatus for growing a silicon ingot and, more particularly, to an apparatus in which the driving axis of a graphite crucible is modified.

2. Background of the Related Art

A perfect wafer is necessary for fabricating a highly-integrated circuit device in accordance with the development of semiconductor circuit devices. In order to produce such a high-quality silicon wafer, a high-quality single crystalline silicon ingot is required as well. In known apparatuses for growing a single crystalline silicon ingot, a Czochralski growth method is widely used.

A growth apparatus according to a related art, as shown in FIG. 3, includes a graphite crucible 33 into which a quartz crucible 32 containing a molten silicon 34 is placed. A driving axis 36 is connected to a lower part of the graphite crucible 33 to revolve and to move the graphite crucible up and down so as to support the graphite crucible 33. A heating means 35 heats the graphite crucible 33, and an outer chamber 38 having an insulating wall 37 protects and thermally isolates the graphite crucible 33, heating means 35, and driving axis 36 in part from an external environment. The dotted lines indicate isothermal lines for marking a temperature distribution.

Such an apparatus for growing a single crystalline silicon ingot 31 according to the related art uses the driving axis as shown in FIG. 1. An upper axis of the driving axis 10 is manufactured by processing a graphite pillar, in which a cave 11 is formed at the upper part of the driving axis 10 and a support 12 is formed to be coupled with the graphite crucible 33. The lower part 13 of the driving axis is formed cylindrically so as to be coupled with a rotating means as well as an elevating means (ex. cylinder) to move up and down.

The driving axis of the single crystalline growth apparatus plays the role of supporting, revolving, and moving upward/downward a crucible into which molten silicon is placed. A crystal growth system, which uses a driving axis designed for producing a simple revolution, depends on a fast heat transfer occurring at a place where the driving axis and a cooling system in a chamber are adjacent each other, thereby bringing about instability due to environmental variance. Moreover, a temperature gradient in the molten silicon supported by the driving axis becomes wider due to the heat loss through the driving axis, thereby degrading the quality of crystals.

The growth apparatus having such a driving axis according to the related art, as shown in FIG. 3, brings about excessive heat loss through the driving axis when a single crystalline silicon is grown, thereby widening the temperature gradient inside the silicon melting pot. The temperature gradient, which is directly reflected in the quality of the growing single crystalline silicon, is a major issue for process management. Moreover, heat flux through the driving axis reduces thermal efficiency as well.

SUMMARY OF THE INVENTION

Accordingly, the present invention is directed to an apparatus for growing a silicon ingot that substantially obviates one or more of the problems that arise due to limitations and disadvantages of the related art.

An object of the present invention is to provide an apparatus for growing a silicon ingot which is able to improve a quality of a single crystalline ingot by alleviating the temperature gradient in the molten silicon through improvement of the driving axis of the silicon growing apparatus.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an apparatus for growing a silicon ingot according to the present invention includes a graphite crucible in which a quartz crucible is placed, a driving axis connected to a lower part of the graphite crucible to revolve and move the graphite crucible up and down so as to support the graphite crucible, a heating means to heat the graphite crucible, and an insulating wall to protect and thermally isolate the graphite crucible, heating means, and driving axis in part from the external environment. The driving axis includes a hollow axis part having a hollow interior, an insulating axis part attached to the bottom of the hollow axis part to inhibit heat transfer, and a cylindrical axis part attached to the bottom of the insulating axis part.

Preferably, the insulating axis part is designed to lie at a position corresponding to the insulating wall when the driving axis moves upward and downward and is formed of an anisotropic insulator.

Preferably, the insulating axis part is formed of a plurality of anisotropic insulator discs stacked successively.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

Figure 1:
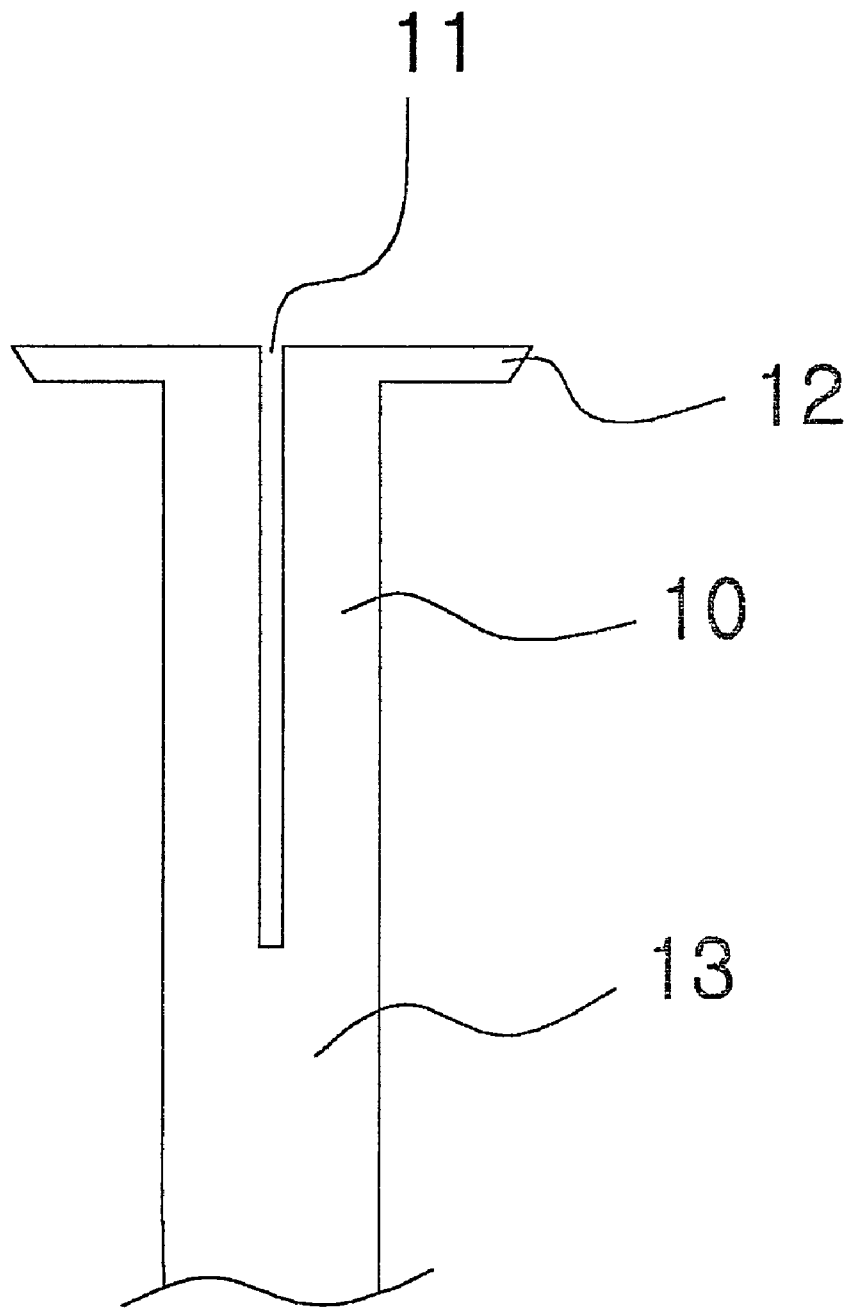
FIG. 1 depicts a driving axis of an apparatus for growing a silicon ingot according to the prior art.
Figure 2:
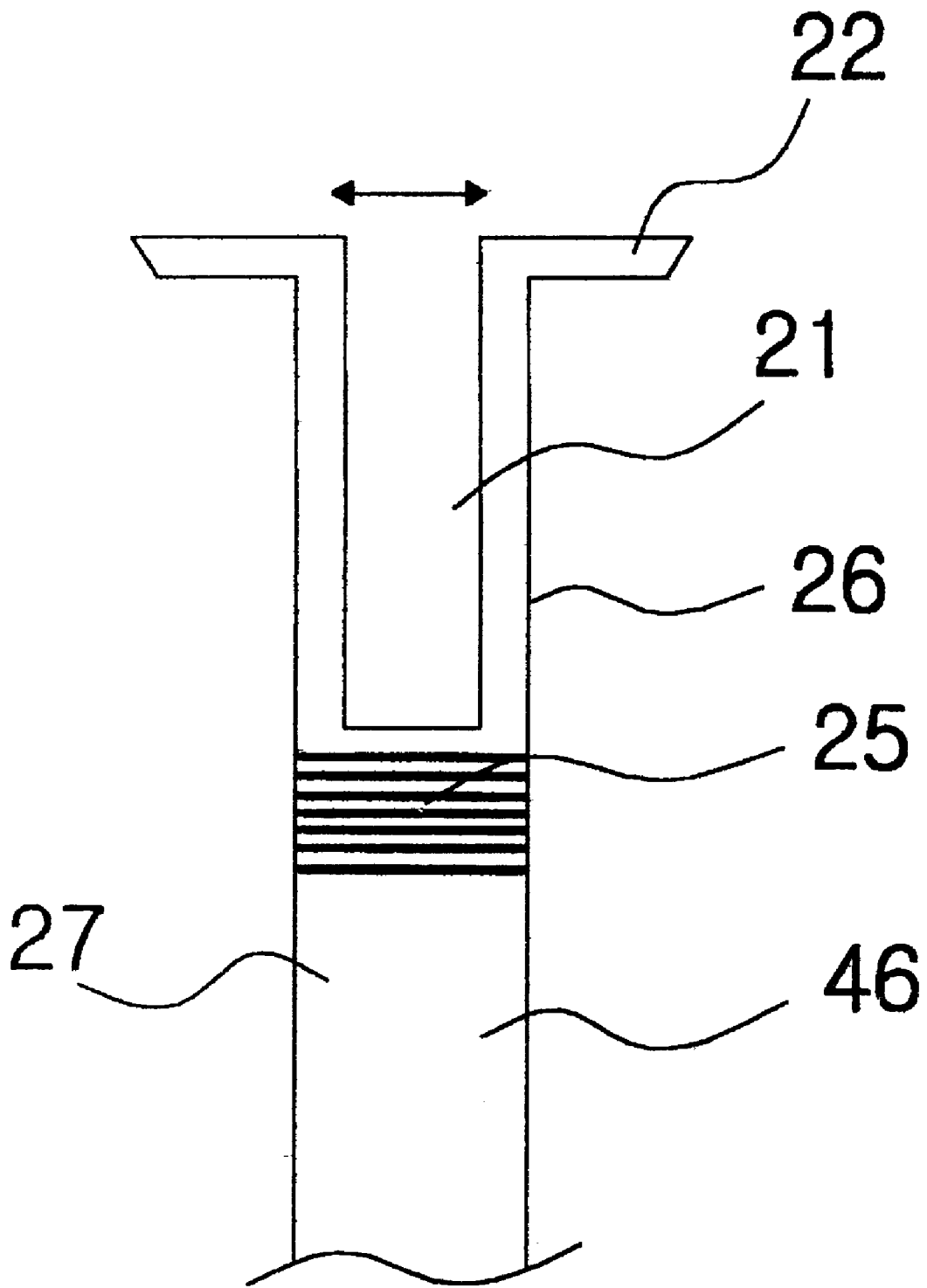
FIG. 2 depicts a driving axis of an apparatus for growing a silicon ingot according to the present invention.
Figure 3:
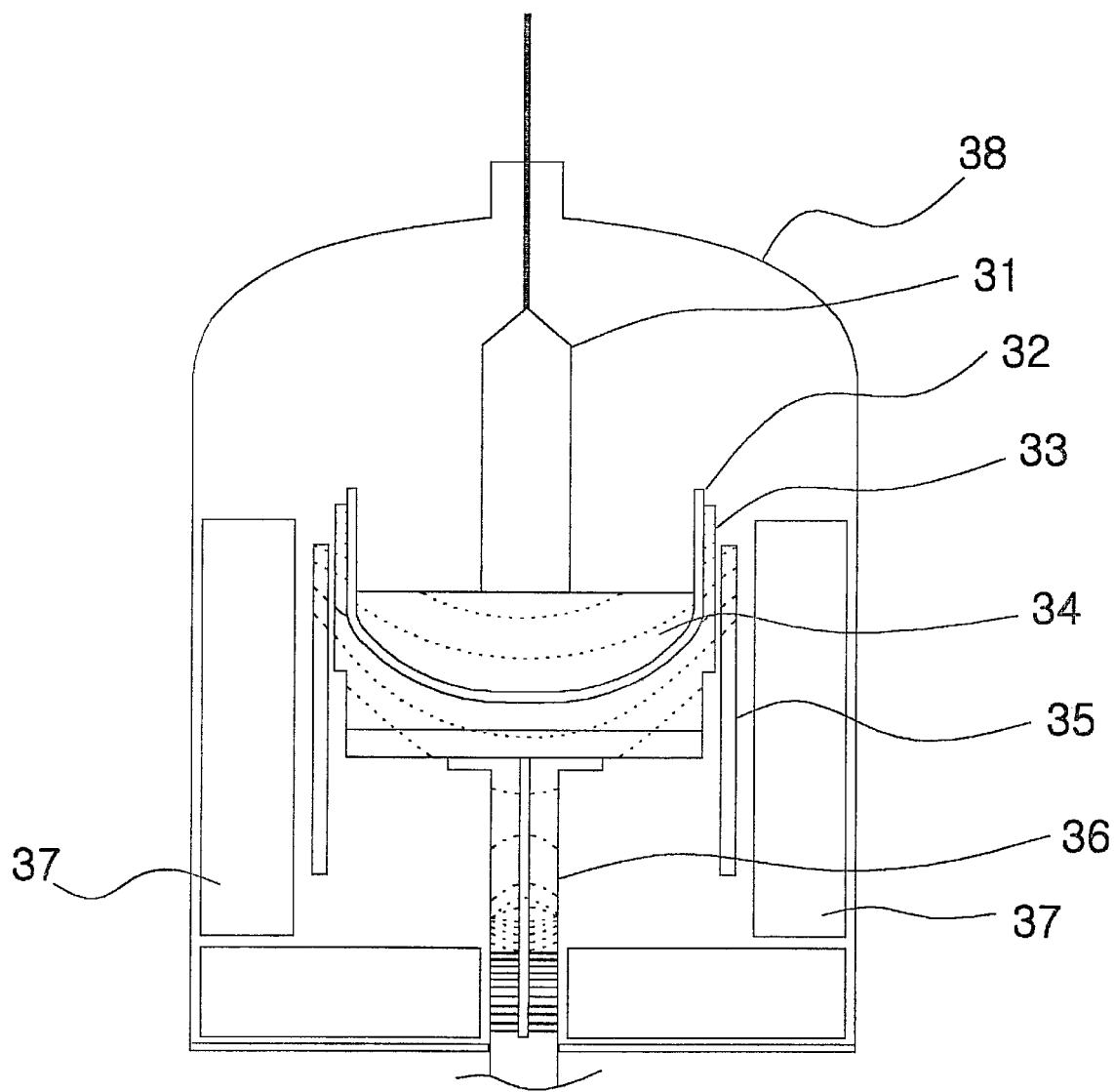
FIG. 3 illustrates an apparatus for growing a silicon ingot according to the prior art.
Figure 4:
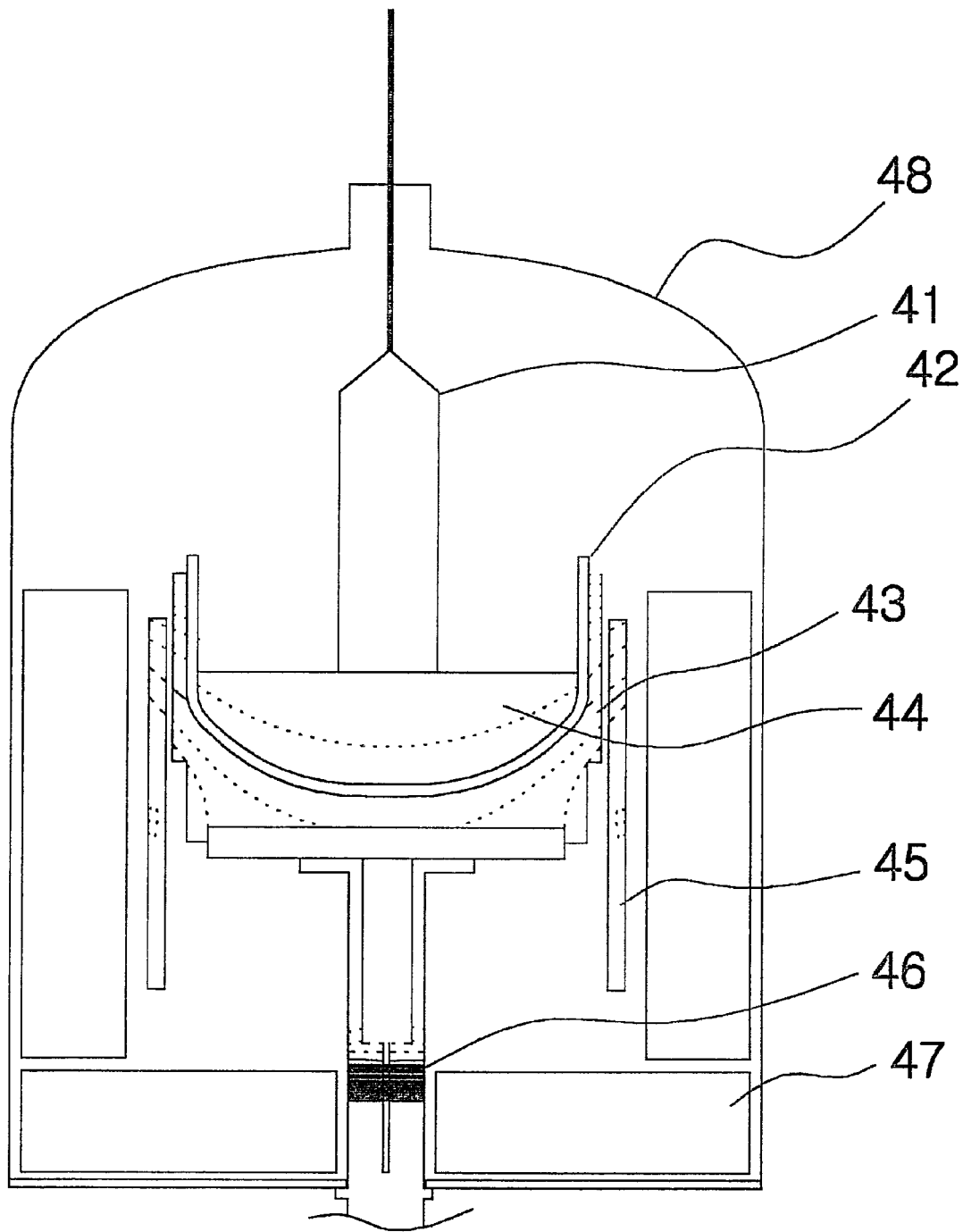
FIG. 4 illustrates an apparatus for growing a silicon ingot according to the present invention.

FIG. 2 and FIG. 4 illustrate a driving axis and an apparatus for growing a silicon ingot, respectively, according to the present invention.

Referring to FIG. 2 and FIG. 4, an apparatus according to the present invention includes a quartz crucible 42, into which a molten silicon 44 will be placed, contained within a graphite crucible 43. A driving axis 46 is connected to a lower part of the graphite crucible 43 to revolve and move the graphite crucible up and down so as to support the graphite crucible 43. The apparatus further includes a heating means 45 for heating the is graphite crucible 43, and an outer chamber 48 having an insulating wall 47 to protect and thermally isolate the graphite crucible 43, heating means 45, and driving axis 46 in part from the external environment. The dotted lines indicate isothermal lines for marking a temperature distribution.

The driving axis 46 according to the present invention includes a hollow axis part 26 having a hollow 21 inside, an insulating axis part 25 attached to the bottom of the hollow axis part 26 to inhibit heat transfer, and a cylindrical axis part 27 attached to the bottom of the insulating axis part 25.

The insulating axis part 25 is formed of an anisotropic insulator, and the hollow and cylindrical axis parts 26 and 27 are formed of a graphite-based material.

According to a preferred embodiment, the insulating axis part 25 is manufactured by stacking a plurality of discs made of anisotropic insulators successively to maximize an insulating characteristic. When stacking the discs, directions of the materials cross each other so as to inhibit heat transfer and maximize efficiency. If the anisotropic insulators are stacked in such a manner, heat conductivity is reduced to almost 1/10 of that of an isotropic insulator. The location of the insulating axis part 25 is designed to lie at a position corresponding to the insulating wall 47 when the driving axis moves upward and downward.

The hollow axis part 26 is manufactured by forming a cave or hollow 21 inside a cylindrical pillar of graphite. The diameter of the hollow is equal to or greater than 30% of the entire diameter of the hollow axis part 26. Preferably, the diameter of the hollow is between 50–70% of the entire diameter of the hollow axis part 26. The larger the hollow gets, the smaller the heat conduction part becomes. Thus, the heat draining away through the lower part is inhibited to the maximum extent so as to reduce the temperature gradient of the hollow axis part. As a result, the temperature gradient of the molten silicon over the hollow axis part is reduced. In this case, it is preferable to make the size of the hollow as large as possible without compromising mechanical stability.

In the above-constructed apparatus according to the present invention, while a process of growing a single crystalline ingot 41 is carried out, heat generated from the heating means 45 is conducted to the graphite crucible 43 and is also transferred to the driving axis 46. The driving axis is placed through the inside and outside of the insulating wall 47 and is also coupled with the driving means outside the insulating wall 47. The temperature difference between the inside and the outside of the insulating wall is very large (over 1000° C.). If the driving axis is not made of the heat insulator like the present invention, large heat flux may flow outside through the driving axis. The driving axis according to the present invention is made of an anisotropic insulator which connects the hollow axis part 26 to the cylindrical axis part 27, thereby enabling the insulating axis part 25 to separate the hollow axis part from the cylindrical axis part to reduce the heat flow.

Therefore, the present invention reduces the temperature gradient of the molten silicon in a hot zone and a quartz crucible and improves the heat distribution uniformly, thereby enabling an improvement in the quality of a single crystalline ingot.

Accordingly, the present invention improves heat efficiency by reducing heat loss, decreases the temperature gradient of the molten silicon in the quartz crucible, and improves the temperature distribution, thereby reducing defects in the silicon ingot remarkably.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. An apparatus for growing a silicon ingot, comprising:
   a graphite crucible in which a quartz crucible is placed;
   a driving axis connected to a lower part of the graphite crucible to revolve and move the graphite crucible up and down so as to support the graphite crucible, said driving axis including, a hollow axis part having a hollow inside, an insulating axis part attached to a bottom of the hollow axis part to inhibit heat transfer, and a cylindrical axis part attached to a bottom of the insulating axis part;
   a heating means for heating the graphite crucible; and
   an insulating wall to protect and thermally isolate the graphite crucible, heating means, and driving axis in part from an external environment.

2. The apparatus of claim 1, wherein the insulating axis part is formed of an anisotropic insulator.

3. The apparatus of claim 1, wherein the hollow and cylindrical axis parts are formed of a graphite-based material and wherein a diameter of the hollow is at least 30% of an entire diameter of the hollow axis part.

4. The apparatus of claim 3, wherein the diameter of the hollow is between 50–70% of the entire diameter.

5. The apparatus of claim 1, wherein the insulating axis part lies at a position corresponding to the insulating wall when the driving axis moves upward and downward.

6. The apparatus of claim 2, wherein the insulating axis part is formed of a plurality of anisotropic insulator discs stacked successively.

7. The apparatus of claim 3, wherein the insulating axis part is manufactured by stacking successively a plurality of anisotropic discs of which directions of anisotropic insulators cross each other.

* * * * *